United States Patent
Post et al.

(10) Patent No.: US 8,892,981 B2
(45) Date of Patent: Nov. 18, 2014

(54) DATA RECOVERY USING OUTER CODEWORDS STORED IN VOLATILE MEMORY

(75) Inventors: Daniel J. Post, Cupertino, CA (US); Kenneth Herman, San Jose, CA (US)

(73) Assignee: Apple Inc., Cupertino, CA (US)

( * ) Notice: Subject to any disclaimer, the term of this patent is extended or adjusted under 35 U.S.C. 154(b) by 1042 days.

(21) Appl. No.: 12/895,031

(22) Filed: Sep. 30, 2010

(65) Prior Publication Data

US 2012/0084627 A1    Apr. 5, 2012

(51) Int. Cl.
| | | |
|---|---|---|
| G11C 29/00 | (2006.01) | |
| G11C 29/52 | (2006.01) | |
| G11C 16/34 | (2006.01) | |
| G06F 11/10 | (2006.01) | |
| H03M 13/27 | (2006.01) | |
| H03M 13/09 | (2006.01) | |
| G11C 29/04 | (2006.01) | |
| H03M 13/15 | (2006.01) | |

(52) U.S. Cl.
CPC ......... *H03M 13/2707* (2013.01); *G11C 29/52* (2013.01); *G11C 16/3418* (2013.01); *H03M 13/09* (2013.01); *G11C 2029/0411* (2013.01); *H03M 13/152* (2013.01); *G06F 11/1048* (2013.01); *H03M 13/1515* (2013.01)
USPC ....................................... 714/763

(58) Field of Classification Search
USPC ....................................... 714/763
See application file for complete search history.

(56) References Cited

U.S. PATENT DOCUMENTS

| | | | |
|---|---|---|---|
| 6,529,997 | B1 | 3/2003 | Debiez et al. |
| 7,139,863 | B1 | 11/2006 | Defouw et al. |
| 7,366,825 | B2 | 4/2008 | Williams et al. |
| 7,389,397 | B2 | 6/2008 | Paley et al. |
| 8,151,060 | B2 | 4/2012 | Mizushima |
| 8,316,278 | B2 * | 11/2012 | Ahn et al. ............... 714/763 |
| 8,341,375 | B2 | 12/2012 | So et al. |
| 8,458,564 | B2 * | 6/2013 | Murray et al. ............... 714/763 |
| 8,478,796 | B2 | 7/2013 | Post et al. |
| 2005/0091569 | A1 | 4/2005 | Chao |
| 2006/0064539 | A1 | 3/2006 | Mukaida et al. |

(Continued)

FOREIGN PATENT DOCUMENTS

| | | |
|---|---|---|
| EP | 0242595 | 10/1987 |
| WO | 2005/043378 | 5/2005 |

OTHER PUBLICATIONS

Apte et al. "Adding Parity to the Linux ext3 File System." ACM SIGOPS Operating Systems Review. vol. 41. Issue 1, Jan. 2007, pp. 56-65.

*Primary Examiner* — Albert Decady
*Assistant Examiner* — Enam Ahmed
(74) *Attorney, Agent, or Firm* — Van Court & Aldridge LLP (57) ABSTRACT

Systems and methods are disclosed for data recovery using outer codewords stored in volatile memory. Outer codewords can be associated with one or more horizontal portions or vertical portions of a non-volatile memory ("NVM"). In some embodiments, an NVM interface of an electronic device can program user data to a super block of the NVM. The NVM interface can then determine if a program disturb has occurred in the super block. In response to detecting that a program disturb has occurred in the super block, the NVM interface can perform garbage collection on the super block. The NVM interface can then use outer codewords associated with the super block to recover from any uncorrectable error correction code errors detected in the super block.

28 Claims, 5 Drawing Sheets (56) References Cited

U.S. PATENT DOCUMENTS

| | | |
|---|---|---|
| 2007/0022241 A1 | 1/2007 | Sinclair |
| 2007/0083697 A1 | 4/2007 | Birrell et al. |
| 2007/0268905 A1 | 11/2007 | Baker et al. |
| 2008/0010580 A1 | 1/2008 | Anderson et al. |
| 2008/0098157 A1 | 4/2008 | Andrewartha et al. |
| 2008/0126848 A1 | 5/2008 | Yoshida |
| 2008/0270730 A1 | 10/2008 | Lasser et al. |
| 2008/0288712 A1 | 11/2008 | Cornwell et al. |
| 2009/0100115 A1 | 4/2009 | Park et al. |
| 2009/0157950 A1 | 6/2009 | Selinger |
| 2009/0157989 A1 | 6/2009 | Karamcheti et al. |
| 2009/0158085 A1 | 6/2009 | Kern et al. |
| 2009/0172262 A1 | 7/2009 | Olbrich et al. |
| 2009/0172335 A1 | 7/2009 | Kulkarni et al. |
| 2009/0172466 A1 | 7/2009 | Royer et al. |
| 2009/0216832 A1* | 8/2009 | Quinn et al. ............... 709/203 |
| 2010/0106753 A1 | 4/2010 | Prabhakaran et al. |
| 2010/0131697 A1 | 5/2010 | Alrod et al. |
| 2010/0281341 A1 | 11/2010 | Wu et al. |
| 2011/0022780 A1 | 1/2011 | Wakrat et al. |
| 2011/0055454 A1 | 3/2011 | Byom et al. |
| 2011/0072189 A1 | 3/2011 | Post et al. |
| 2011/0107013 A1 | 5/2011 | Ho |
| 2011/0185112 A1 | 7/2011 | Goss |
| 2011/0231713 A1 | 9/2011 | Takada et al. |
| 2011/0238886 A1 | 9/2011 | Post et al. |
| 2011/0271039 A1 | 11/2011 | Baek et al. |
| 2012/0005559 A1 | 1/2012 | Jeong et al. |
| 2012/0159281 A1* | 6/2012 | Shalvi et al. ............... 714/755 |
| 2014/0019826 A1* | 1/2014 | Eggleston et al. ........... 714/773 |

\* cited by examiner

DATA RECOVERY USING OUTER CODEWORDS STORED IN VOLATILE MEMORY

BACKGROUND OF THE DISCLOSURE

NAND flash memory, as well as other types of non-volatile memories ("NVMs"), are commonly used for mass storage. For example, consumer electronics such as portable media players often include flash memory to store music, videos, and other media.

NVMs, however, may develop defective memory cells through everyday use, and operational memory cells may suffer from program disturbs due to voltages applied to neighboring cells. Thus, in order to correct for data errors caused by program disturbs, a system may apply an error correcting code to user data (e.g., data stored by an application) that will be stored in the NVM in order to generate "parity data". The resulting parity data can then be stored along with the user data in the NVM. Upon detection of an error in the user data, the system can attempt to use the parity data to correct for the error.

SUMMARY OF THE DISCLOSURE

Systems and methods are disclosed for data recovery using outer codewords stored in volatile memory. As used herein, the term "outer codeword" can refer to any suitable data (e.g., metadata) that can be generated by applying an error correcting or detecting code to user data, where the outer codeword may be used to verify the user data, correct the user data, or both. In particular, in response to detecting program disturbs in a non-volatile memory ("NVM"), a NVM interface of an electronic device can use outer codewords stored in the volatile memory to recover user data stored in one or more pages of the NVM. In some embodiments, the outer codewords can be associated with various specific portions of the NVM.

BRIEF DESCRIPTION OF THE DRAWINGS

The above and other aspects and advantages of the invention will become more apparent upon consideration of the following detailed description, taken in conjunction with accompanying drawings, in which like reference characters refer to like parts throughout, and in which.

DETAILED DESCRIPTION OF THE DISCLOSURE

Systems and methods for data recovery using outer codewords stored in volatile memory are provided. As used herein, the term "outer codeword" can refer to any suitable data (e.g., metadata) that can be generated by applying an error correcting or detecting code to user data, where the outer codeword may be used to verify the user data, correct the user data, or both. Outer codewords can be associated with one or more horizontal portions (e.g., one or more stripes or super blocks) of a non-volatile memory ("NVM"). Alternatively, outer codewords can be associated with one or more vertical portions (e.g., one or more dies, one or more buses, one or more CE lines, and/or one or more banks of a super block) of the NVM.

For example, while an NVM interface of an electronic device is programming user data to a page of a super block, an outer codeword stored in volatile memory can be simultaneously updated. The outer codeword can be associated with the same portion of the NVM where the page is located.

In response to detecting that one or more program disturbs have occurred in the super block, the NVM interface can perform garbage collection on the super block. The NVM interface can then use at least the outer codeword to recover from any uncorrectable error correction code ("uECC") errors detected in the page. As used herein, user data can be considered uECC when it is not recoverable using the decoding techniques associated with that particular ECC scheme.

Outer codewords can also be used to correct for errors detected in one or more pages of the NVM (e.g., a portion of a super block, a super block, or multiple super blocks). In some embodiments, because outer codewords are being stored in volatile memory, the NVM interface can reset the values of outer codewords once the NVM interface crosses into a different region of the NVM (e.g., a different portion of a super block, a different super block, or a different set of super blocks) while programming user data.

Figure 1:
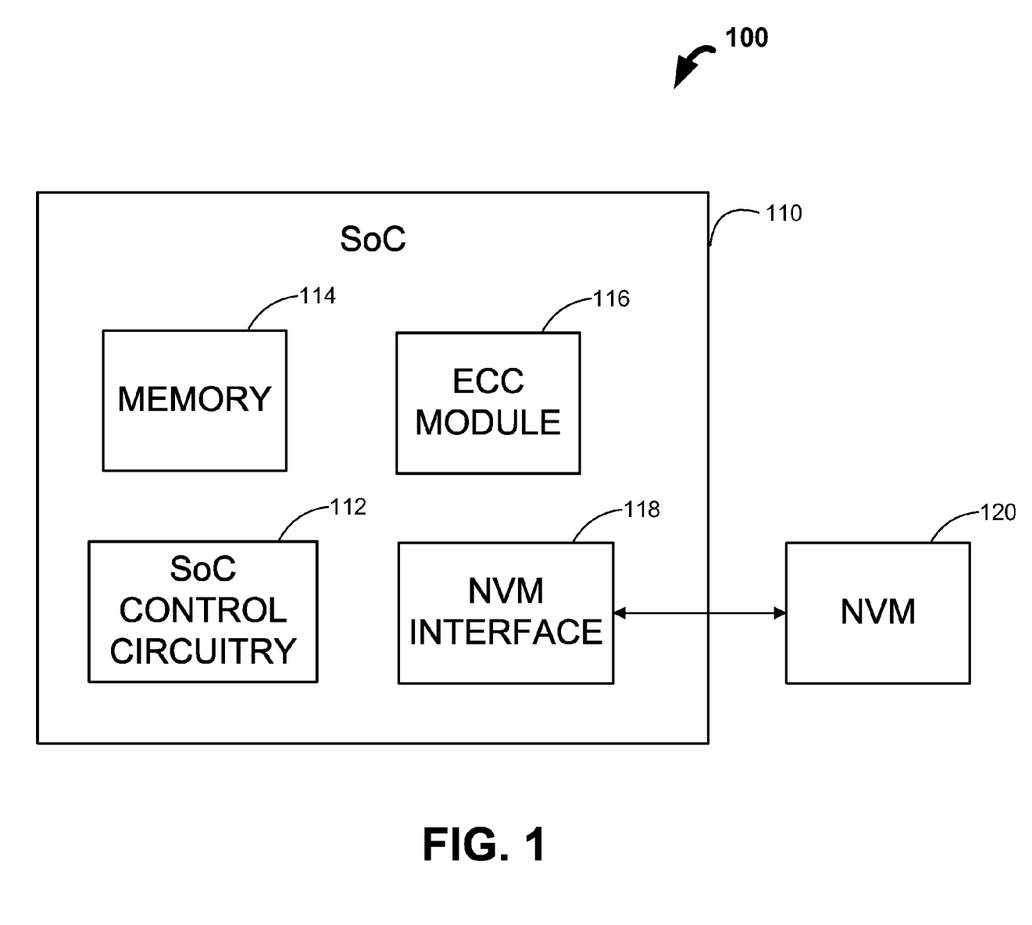
FIG. 1 is an illustrative block diagram of an electronic device configured in accordance with various embodiments of the invention.

FIG. 1 illustrates a block diagram of electronic device 100. In some embodiments, electronic device 100 can be or can include a portable media player (e.g., an iPod™ made available by Apple Inc. of Cupertino, Calif.), a cellular telephone (e.g., an iPhone™ made available by Apple Inc.), a pocket-sized personal computer, a personal digital assistance ("PDA"), a desktop computer, a laptop computer, and any other suitable type of electronic device.

Electronic device 100 can include system-on-a-chip ("SoC") 110 and non-volatile memory ("NVM") 120. Non-volatile memory 120 can include a NAND flash memory based on floating gate or charge trapping technology, NOR flash memory, erasable programmable read only memory ("EPROM"), electrically erasable programmable read only memory ("EEPROM"), Ferroelectric RAM ("FRAM"), magnetoresistive RAM ("MRAM"), or any combination thereof.

NVM 120 can include one or more vertical portions. For example, NVM 120 can include multiple dies, where one or more dies can be connected to a chip enable ("CE") line. By changing the value of a CE line, a system may be able to access a particular die.

In some embodiments, the memory locations of each die can be organized into one or more "planes". Different dies or planes can concurrently carry out access operations to its respective memory locations (e.g., program, read, and erase operations). As used herein, each die or plane of NVM 120 can be referred to as a "bank" of NVM 120.

Electrical interfaces connected to vertical portions of NVM 120 may be referred to as "buses". In some cases, depending on the type of NAND configuration, each bus and/or CE line can be an independent hardware element in NVM 120.

In addition to one or more vertical portions, NVM 120 can also include one or more horizontal portions. For example, memory locations of each die or plane can be organized into "blocks", which is the smallest erasable unit, and further organized into "pages", which can be the smallest unit that can be programmed or read. Memory locations (e.g., blocks or pages of blocks) from corresponding integrated circuits may form "super blocks". In some embodiments, each memory location of NVM 120 can be referenced using a physical address (e.g., a physical page address or physical block address).

System-on-a-chip 110 can include SoC control circuitry 112, memory 114, error correction code ("ECC") module 116, and NVM interface 118. SoC control circuitry 112 can control the general operations and functions of SoC 110 and the other components of SoC 110 or device 100. For example, responsive to user inputs and/or the instructions of an application or operating system, SoC control circuitry 112 can issue read or write commands to NVM interface 118 to obtain data from or store data in NVM 120. For clarity, data that SoC control circuitry 112 may request for storage or retrieval may be referred to as "user data," even though the data may not be directly associated with a user or user application. Rather, the user data can be any suitable sequence of digital information generated or obtained by SoC control circuitry 112 (e.g., via an application or operating system).

SoC control circuitry 112 can include any combination of hardware, software, and firmware, and any components, circuitry, or logic operative to drive the functionality of electronic device 100. For example, SoC control circuitry 112 can include one or more processors that operate under the control of software/firmware stored in NVM 120 or memory 114.

Memory 114 can include any suitable type of volatile memory, such as random access memory ("RAM") (e.g., static RAM ("SRAM"), dynamic random access memory ("DRAM"), synchronous dynamic random access memory ("SDRAM"), double-data-rate ("DDR") RAM), cache memory, read-only memory ("ROM"), or any combination thereof. Memory 114 can include a data source that can temporarily store user data for programming into or reading from non-volatile memory 120. In some embodiments, memory 114 may act as the main memory for any processors implemented as part of SoC control circuitry 112.

ECC module 116 can apply one or more error correcting or error detecting codes to user data, such as a XOR code, a Reed-Solomon ("RS") code, a Bose, Chaudhuri and Hocquenghem ("BCH") code, a cyclic redundancy check ("CRC") code, or any other suitable error correcting or detecting code. Although ECC module 116 is shown in FIG. 1 as included in SoC 110, persons skilled in the art will appreciate that ECC module 116 may instead be implemented in NVM 120.

By applying one or more error correcting or detecting codes to user data, ECC module 116 can generate one or more "outer codewords". As used herein, the term "outer codeword" can refer to any suitable data (e.g., metadata) that can be generated by applying an error correcting or detecting code to user data, where the outer codeword may be used to verify the user data, correct the user data, or both.

Outer codewords can be continuously updated as user data is being programmed into one or more memory locations of NVM 120 (e.g., one or more blocks or one or more super blocks of NVM 120). Consequently, outer codewords can be used to correct and/or verify the user data stored in the one or more memory locations.

Generally, ECC module 116 can provide greater protection for certain user data by increasing the number of outer codewords associated with the user data. That is, by running multiple error correcting codes on the user data and generating additional sets of outer codewords, ECC module 116 can detect and/or correct for additional errors in the user data.

NVM interface 118 may include any suitable combination of hardware, software, and/or firmware configured to act as an interface or driver between SoC control circuitry 112 and NVM 120. For any software modules included in NVM interface 118, corresponding program code may be stored in NVM 120 or memory 114.

NVM interface 118 can perform a variety of functions that allow SoC control circuitry 112 to access NVM 120 and to manage the memory locations (e.g., pages, blocks, super blocks, dies, CE lines, buses, banks, etc.) of NVM 120 and the data stored therein (e.g., user data). For example, NVM interface 118 can interpret the read or write commands from SoC control circuitry 112, perform wear leveling, and generate read and program instructions compatible with the bus protocol of NVM 120.

While NVM interface 118 and SoC control circuitry 112 are shown as separate modules, this is intended only to simplify the description of the embodiments of the invention. It should be understood that these modules may share hardware components, software components, or both. For example, SoC control circuitry 112 may execute a software-based memory driver for NVM interface 118.

In some embodiments, electronic device 100 can include a target device, such as a flash memory drive or SD card, that includes NVM 120 and some or all portions of NVM interface 118. In these embodiments, SoC 110 or SoC control circuitry 112 may act as the host controller for the target device. For example, as the host controller, SoC 110 can issue read and write requests to the target device.

Figure 2:
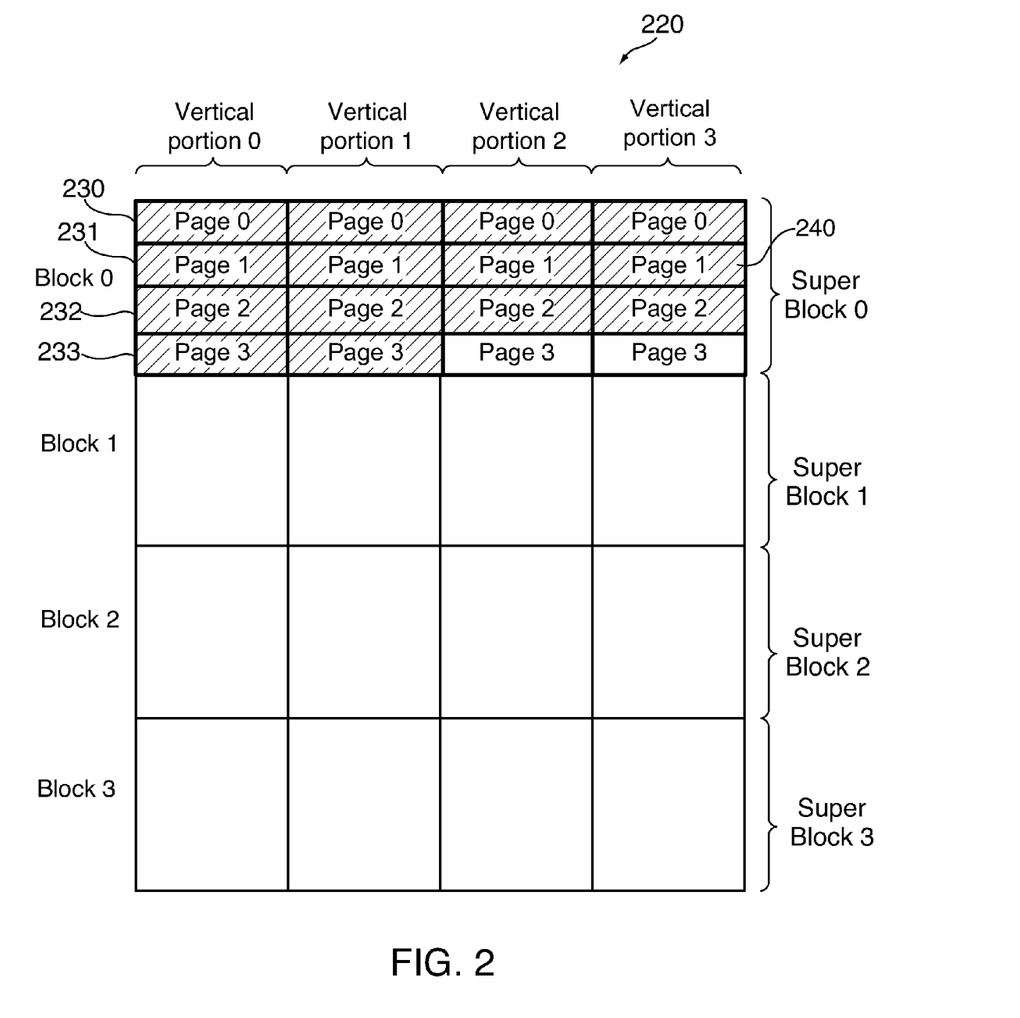
FIG. 2 is a functional view of a non-volatile memory in accordance with various embodiments of the invention.

As mentioned above, a NVM (e.g., NVM 120 of FIG. 1) can be organized into multiple vertical portions (e.g., dies, CE lines, buses, and/or banks) and multiple horizontal portions (e.g., blocks, pages, and/or super blocks). Turning now to FIG. 2, a functional view of NVM 220 is shown.

NVM 220 can include one or more vertical portions (e.g., dies, CE lines, buses, and/or banks), such as vertical portion 0, vertical portion 1, vertical portion 2, and vertical portion 3. Each vertical portion may then be organized into one or more horizontal portions (e.g., one or more blocks). For example, vertical portions 0-3 are illustrated as each being organized into blocks 0-3.

Each block may be organized into one or more pages. For example, block 0 of each of vertical portions 0-3 is illustrated as being organized into pages 0-3. Persons skilled in the art will appreciate that FIG. 2 is merely meant to illustrate the organizational layout of a NVM and do not indicate an actual, physical layout of the NVM. In addition, although a certain number of vertical portions, blocks, and pages are shown in FIG. 2, this is merely for the purpose of illustration and one skilled in the art can appreciate that a NVM could include any suitable number of vertical portions, blocks, and pages.

NVM 220 can further include one or more super blocks that include memory locations of a single block from one or more vertical portions. Super blocks provide operational parallelism, thereby enabling parallel programming, reading, and erase operations to be performed on memory locations located in different vertical portions.

In some embodiments, a super block can include one block from each vertical portion, where the blocks have the same positions in the vertical portions. For example, as shown in FIG. 2, super block 0 of NVM 220 can include block 0 of each of vertical portions 0-3. Similarly, super block 1 of NVM 220 can include block 1 of each of vertical portions 0-3, super block 2 of NVM 220 can include block 2 of each of vertical portions 0-3, and so forth.

Thus, each super block of NVM 220 can include one or more "stripes" that are formed by one page from each vertical portion of the super block, where the pages may sometimes have the same page numbers in the vertical portions. For example, FIG. 2 shows stripes 230-233. Stripe 230 can include page 0 from each of vertical portions 0-3 of super block 0, stripe 231 can include page 1 from each of vertical portions 0-3 of super block 0, and so forth.

In other embodiments, a super block can be formed by virtually linking or "striping" together a subset of memory locations of one block from one or more vertical portions of NVM 220. The subset of memory locations need not be in the same page of each vertical portion to be virtually linked as a super block.

During operation of NVM 220, the pages of a stripe and/or super block may be sequentially processed. For example, during a read or write operation of super block 0, stripe 230 may be processed first, where page 0 of vertical portion 0 may be processed initially, followed by page 0 of vertical portion 1, then followed by page 0 of vertical portion 2, and so forth. Correspondingly, after processing stripe 230, stripes 231 may be processed in a similar manner, followed by stripe 232, and further followed by stripe 233.

When user data is being written to NVM 220, an NVM interface (e.g., NVM interface 118 of FIG. 1) or an ECC module (e.g., ECC module 116 of FIG. 1) can calculate an "outer codeword" based on the user data. As previously mentioned, "outer codewords" may refer to any suitable data that can be used to verify and/or correct user data stored in one or more pages of NVM 220.

For example, in order to generate an outer codeword, an ECC module (e.g., ECC module 116 of FIG. 1) of an electronic device can apply an error correcting code to user data stored in one or more pages. That is, the outer codewords can be generated using any reversible operation including, for example, a parity operation, a sum operation, a XOR operation, and/or any other suitable operation.

In some cases, the ECC module can apply additional error correcting codes to the user data in order to generate additional codewords. For example, in order to generate two outer codewords, the ECC module can apply two different types of error correcting codes (e.g., a XOR code and a BCH code) to the user data.

Additional codewords can allow more errors to be corrected in the user data. Persons skilled in the art will appreciate that any suitable number of outer codewords can be generated depending on the amount of data protection desired.

Outer codewords can be used to correct for errors detected in user data in any suitable manner. For example, an NVM interface may determine that at least one uncorrectable error correction coding ("uECC") error has been detected in a portion of the NVM (e.g., a super block). As used herein, "uECC errors" may be those errors detected in user data that are not easily recoverable (e.g., user data is not recoverable using the decoding techniques associated with that particular ECC scheme). This may be in contrast to "correctable errors", where data recovery may be comparatively easy. After detecting the uECC error, the NVM interface can identify one or more pages where the at least one uECC error was detected.

The NVM interface can then read user data stored in the other pages of the super block (e.g., one or more pages of the super block that excludes the one or more identified pages). Finally, the NVM interface can use one or more outer codewords associated with the super block and the user data stored in the other pages to recover from the at least one uECC error in the identified pages. For example, the user data stored in the identified pages can be recovered by reversing out of the outer codewords using user data stored in the other pages (e.g., by subtracting the user data stored in the other pages from the one or more outer codewords).

Outer codewords can be associated with any suitable portion of NVM 220. In some embodiments, one or more outer codewords can be associated with horizontal portions of NVM 220. For example, one or more outer codewords can be associated with a super block of NVM 220. As shown in FIG. 2, for instance, a NVM interface can program user data to super block 0 of NVM 220. As user data is being programmed sequentially to each page of super block 0, one or more outer codewords associated with super block 0 can be continuously updated. Once the NVM interface has finished programming super block 0, the one or more outer codewords can be used to correct for data errors in super block 0.

In some cases, the updating process can occur in one or more steps. For example, after the NVM interface programs page 0 of vertical portion 0, outer codewords associated with super block 0 may have values that have been generated for user data stored in that page. Thus, once the NVM interface has finished programming new user data to page 0 of vertical portion 1, an ECC module can apply error correcting codes to the new user data to generate ECC data. A NVM interface can then update the outer codewords associated with super block 0 with the ECC data (e.g., by accumulating the value of the ECC data into the outer codewords).

Thus, persons skilled in the art will appreciate that the updating of outer codewords can sometimes involve both an ECC module and a NVM interface. For the sake of simplicity, however, the following discussion will refer to updating outer codewords using a NVM interface.

As another example, one or more outer codewords can be associated with each stripe of a super block. As shown in FIG. 2, for instance, the NVM interface may be programming user data to the pages of stripe 230. While the NVM interface is programming the user data, one or more outer codewords associated with stripe 230 (e.g., a first set of outer codewords) can be continuously updated. Once the NVM interface begins to program stripe 231, a different set of outer codewords associated with stripe 231 (e.g., a second set of outer codewords) can be updated. This way, once the NVM interface has finished programming super block 0, each set of outer codewords can be used to correct errors in a corresponding stripe of super block 0.

In other embodiments, one or more outer codewords can be associated with different vertical portions of NVM 220 (e.g., one or more dies of a super block, one or more buses of a super block, one or more CE lines of a super block, and/or one or more banks of a super block). The choice of which vertical portions to use for data recovery may depend on a variety of factors, such as, for example, the level of data protection desired, one or more vendor-specific characteristics of the NVM, the amount of volatile memory that is available, any other suitable factor(s), and/or any combination thereof.

For example, while the NVM interface is programming user data to page 0 of vertical portion 0, one or more outer codewords associated with vertical portion 0 (e.g., a first set of outer codewords) can be updated. Once the NVM interface begins to program page 0 of vertical portion 1, a different set of outer codewords associated with vertical portion 1 (e.g., a second set of outer codewords) can be updated. In the example illustrated in FIG. 1, for instance, in order to program super block 0, four different sets of outer codewords (e.g., one set of outer codewords for each vertical portion) may be updated. Persons skilled in the art will appreciate that this is merely an illustrative example. Thus, the NVM interface can maintain outer codewords for any suitable combination of vertical portions of NVM 220.

In some embodiments, one or more outer codewords can be generated for each bus of NVM 220. In some cases, because a NVM may have only a few buses (e.g., one to four buses), the level of protection provided by such an implementation may not be as robust as in other implementations. For example, if a single outer codeword is associated with each bus of a super block, the ECC module may only be able to correct for a single error in each bus. On the other hand, since buses are generally independent from each other, this approach can be simple to implement, and in most instances, may offer sufficient data protection. Moreover, such an implementation may only require a small amount of memory for storing the resulting outer codewords.

Conventionally, outer codewords are stored in the NVM itself. As a result, portions of the NVM may need to be made available for storing outer codewords, thereby reducing the amount of space available for storing actual user data.

In order to reduce overhead costs associated with storing outer codewords in the NVM, the NVM interface can instead be configured to store outer codewords in volatile memory (e.g., memory 114 of FIG. 1). Although this may limit the types of errors that can be corrected, such an approach can provide error correction without imposing space requirements on the NVM.

Figure 3:
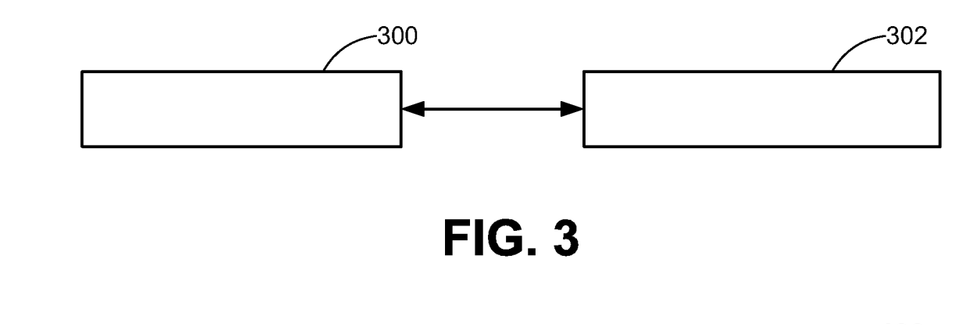
FIG. 3 shows one set of illustrative buffers in a volatile memory in accordance with various embodiments of the invention.

In some embodiments, one or more buffers in volatile memory can be used to store outer codewords For example, turning now to FIG. 3, an illustrative set of buffers 300 and 302 in volatile memory are shown. Buffers 300 and 302 can be any suitable type of double buffers such as, for example, ping-pong buffers.

In a configuration where two outer codewords or two sets of outer codewords are being updated by a NVM interface (e.g., NVM interface 118 of FIG. 1), each of buffers 300 and 302 can store one or more outer codewords associated with a different portion of a NVM.

For example, as mentioned above, an ECC module (e.g., ECC module 116 of FIG. 1) can generate one or more outer codewords for each stripe of a block or super block. For instance, referring to both FIGS. 2 and 3, buffer 300 can be used to store a first outer codeword, which may be associated with stripe 230 of NVM 220. Thus, if the NVM interface is programming user data to stripe 230, the NVM interface can update the first outer codeword stored in buffer 300.

Once the NVM interface has reached the end of stripe 230, the NVM interface can use buffer 302 to store a second outer codeword, which may be associated with stripe 231 of NVM 220. As the NVM interface begins to program user data to stripe 231, the NVM interface can switch to buffer 302 and store updates to the second outer codeword in buffer 302. Persons skilled in the art will appreciate that although only two buffers are shown in FIG. 3, the volatile memory can include any suitable number of buffers for storing outer codewords associated with various portions of a NVM.

In some embodiments, instead of having multiple buffers, the volatile memory can include a single buffer for storing one or more outer codewords. For example, the single buffer can be used to store a first outer codeword associated with stripe 230. In response to reaching the end of stripe 230, the NVM interface can copy the first outer codeword from the buffer to a different location in the volatile memory. Then, once the NVM interface begins to program stripe 231, a second outer codeword associated with stripe 231 can be stored in the buffer.

Figure 4:
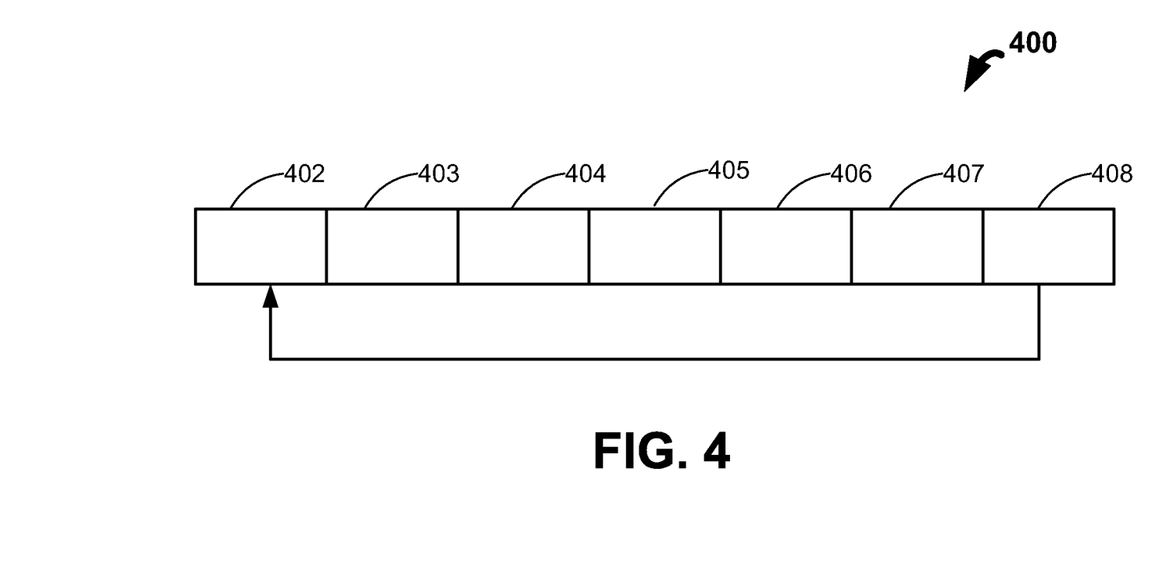
FIG. 4 shows another set of illustrative buffers in a volatile memory in accordance with various embodiments of the invention.

Turning now to FIG. 4, an illustrative circular buffer 400 in volatile memory is shown. Circular buffer 400 can include a set of buffer elements 402-408. Persons skilled in the art will appreciate that the number of buffer elements shown in FIG. 4 is merely illustrative. Therefore, circular buffer 400 can include any suitable number of elements. In some embodiments, for example, there may be as many buffer elements as the number of outer codewords (or sets of outer codewords) used to correct user data stored in one or more pages of a NVM. Persons skilled in the art will also appreciate that volatile memory can include any suitable number of circular buffers for storing outer codewords.

Circular buffer 400 can be configured to store multiple outer codewords or sets of outer codewords. In some embodiments, each of buffer elements 402-408 can be used to store an outer codeword associated with a particular portion of a NVM. For instance, referring now to both FIGS. 2 and 4, buffer element 402 can be used to store a first outer codeword, which may be associated with stripe 230 (FIG. 2). Similarly, buffer element 403 can be used to store a second outer codeword, which may be associated with stripe 231 (FIG. 2).

Thus, if the NVM interface is programming user data to stripe 230, the NVM interface can update the first outer codeword stored in buffer element 402. Once the NVM interface has finished programming stripe 230 and begins to program user data to stripe 231, the NVM interface can iterate to buffer element 403. Consequently, the NVM interface can update the second outer codeword stored in buffer element 403.

Thus, for each outer codeword that is updated, the NVM interface can iterate to a different buffer element. Once the NVM interface has reached the last buffer element of circular buffer 400 (e.g., buffer element 408) and an additional buffer is needed, the NVM interface can iterate back to the beginning element of circular buffer 400 (e.g., buffer element 402). In some cases, in addition to iterating back to buffer element 402, the NVM interface can reset the outer codeword stored in buffer element 402 to an initial state or default value. After resetting the outer codeword, the NVM interface can update the outer codeword stored in buffer element 402 based on new user data that is being programmed to the NVM.

In other embodiments, each of buffer elements 402-408 can be used to store a set of outer codewords associated with a portion of a NVM. For example, buffer element 402 can store a first set of outer codewords associated with a first portion of a NVM, and buffer element 403 can store a second set of outer codewords associated with a second portion of the NVM.

In some embodiments, because outer codewords may be reset to initial states after a suitable number of pages have been programmed, outer codewords may be used to correct for errors detected only in those pages. For example, outer codewords can be used to only correct for errors in a block or super block that is currently being programmed.

For instance, the NVM interface can update outer codewords while programming a particular block or super block. Upon detecting an end of the block or super block, however, the NVM interface can reset the outer codewords to one or more initial states (e.g., zeros or ones). In some cases, the one or more initial states can correspond to ECC data that may be generated for an empty block or empty super block. In addition, the NVM interface can clear the portion of the volatile memory (e.g., one or more buffers) used to store the outer codewords.

After resetting the outer codewords, the NVM interface can program user data to a page of a new block or super block, where the page may be located in a particular portion of the NVM. The NVM interface can then update one or more outer codewords associated with that portion of the NVM.

As another example, outer codewords can be used to correct for errors in multiple super blocks (e.g., two or more super blocks). Thus, the NVM interface can delay resetting the outer codewords until it has finished programming a particular set of super blocks and has crossed into a different set of super blocks.

As yet another example, outer codewords can be used to correct for errors in one or more "risk zones" of a NVM. A "risk zone" can be a portion of the NVM determined to be most susceptible to corruption. The risk zone can be any suitable portion of the NVM such as, for example, one or more super blocks or a portion of a super block (e.g., one or more stripes of a super block). In some cases, risk zones can be determined based on one or more characteristics of the NVM provided by a vendor of the NVM. For example, production information provided by a vendor can include a description of pages that may be affected by program failures within a block.

In particular, referring back to FIG. 2, NVM 220 can include risk zone 240, which is illustrated to include those pages of super block 0 that have cross-hatched lines. After determining risk zone 240, the NVM interface can program user data to a page of risk zone 240, where the page may be located in a first stripe of the NVM (e.g., stripe 230). While the NVM interface is programming the user data, the NVM interface can update a first outer codeword that is associated with the first stripe. The NVM interface can then determine if an end of risk zone 240 (e.g., page 3 of vertical portion 1) has been reached. If the NVM interface determines that an end of risk zone 240 has been reached, the NVM interface can reset the first outer codeword and any other outer codewords stored in volatile memory to initial states. If the NVM interface instead determines that an end of risk zone 240 has not been reached, the NVM interface can program user data to a next page of risk zone 240. In some cases, if the next page is located in a second stripe of the NVM (e.g., stripe 231), the NVM interface may also update a second outer codeword associated with the second stripe.

Figure 5:
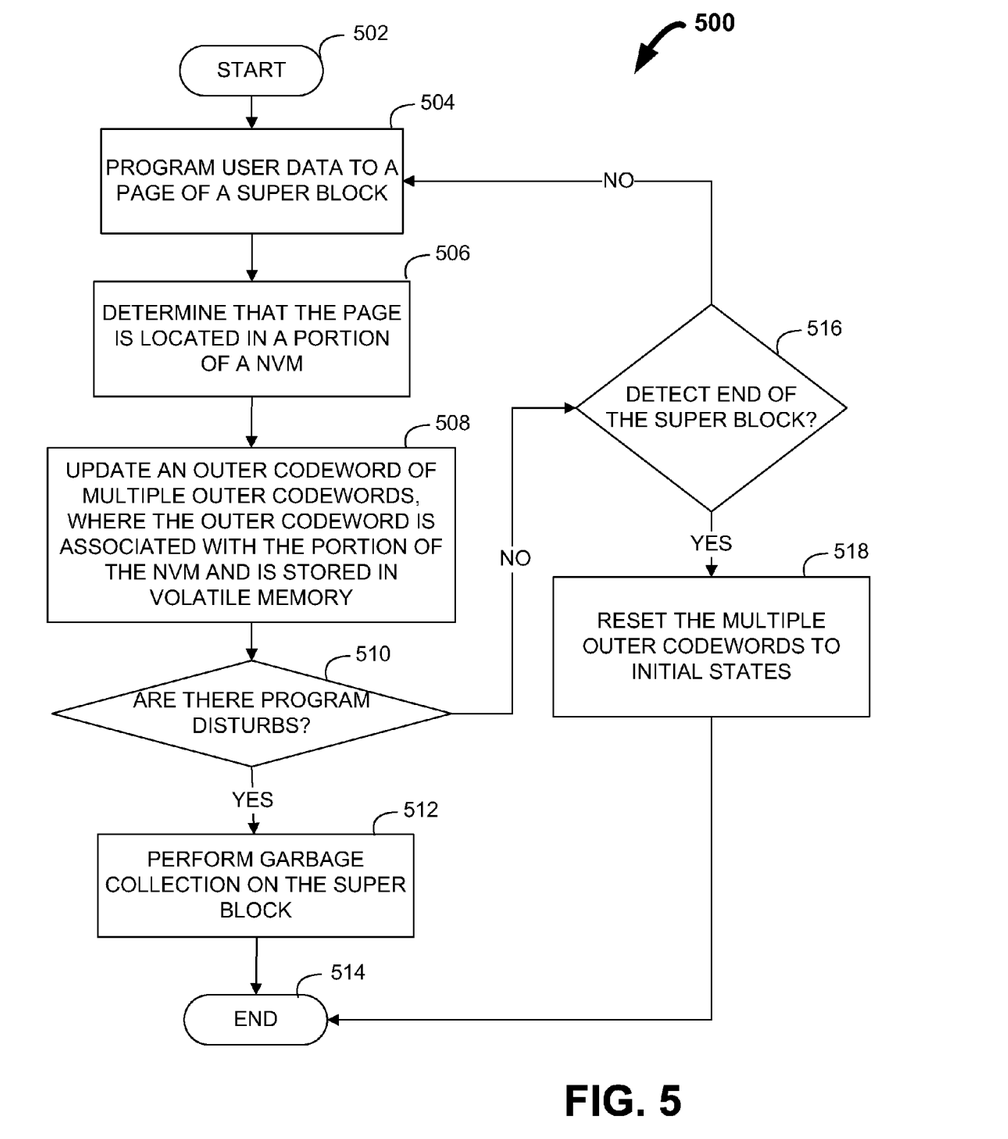
FIG. 5 is a flowchart of an illustrative process for recovering from program disturbs in a non-volatile memory in accordance with various embodiments of the invention.
Figure 6:
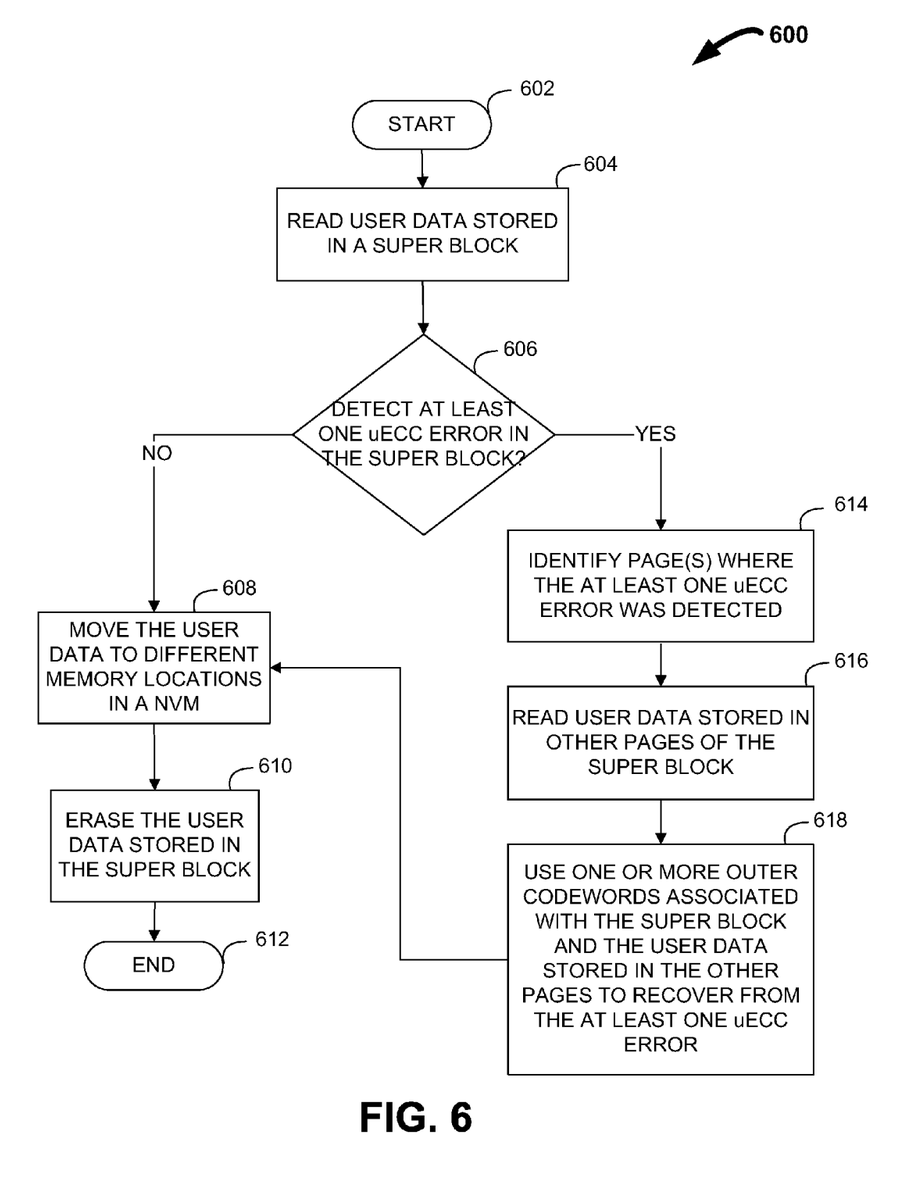
FIG. 6 is a flowchart of an illustrative process for correcting one or more uncorrectable error correction coding errors in a non-volatile memory in accordance with various embodiments of the invention.

Referring now to FIGS. 5 and 6, flowcharts of illustrative processes are shown in accordance with various embodiments of the invention. These processes may be executed by one or more components in a system (e.g., electronic device 100 of FIG. 1). For example, at least some of the steps in the processes of FIGS. 5 and 6 may be performed by a NVM interface (e.g., NVM interface 118 of FIG. 1) or an ECC module (e.g., ECC module 116 of FIG. 1).

Turning first to FIG. 5, process 500 is shown for recovering from program disturbs in a NVM (e.g., NVM 120 of FIG. 1 or NVM 220 of FIG. 2). Process 500 may begin at step 502. At step 504, a NVM interface can program user data to a page of a super block.

Then, at step 506, the NVM interface can determine that the page is located in a portion of the NVM (e.g., a first portion). In some cases, one or more outer codewords may be associated with this first portion of the NVM. For example, the NVM interface may determine that the page is located in a horizontal portion of the NVM (e.g., a block or super block of the NVM) or is located in a vertical portion of the NVM (e.g., one or more dies of a super block, one or more buses of a super block, one or more CE lines of a super block, and/or one or more CAUs of a super block).

At step 508, the NVM interface can update an outer codeword (e.g., a first outer codeword) of multiple outer codewords, where the outer codeword is associated with the portion of the NVM and is stored in volatile memory. For example, an ECC module can apply an error correcting code to the user data stored in the page to generate ECC data. After generating the ECC data, the NVM interface can update the outer codeword with the ECC data. For instance, the NVM interface can accumulate the value of the ECC data into the outer codeword.

Continuing to step 510, the NVM interface can detect if one or more program disturbs have occurred. For example, the NVM interface can detect program disturbs in response to detecting one or more program failures. As another example, the NVM interface can detect program disturbs in response to detecting uECC data on a read back operation while programming one or more portions of the NVM (e.g., one or more stripes of a risk zone). If, at step 510, the NVM interface detects that one or more program disturbs have occurred, process 500 may move to step 512.

At step 512, the NVM interface can perform garbage collection on the super block. Thus, the NVM interface can attempt to move valid data out of the super block. For instance, the NVM interface can copy valid data from the super block to different memory locations in the NVM, thereby invalidating the valid data in the super block. After copying the valid data, the NVM interface can erase the user data stored in the super block. Process 500 may then end at step 514.

Referring back to step 512, if the NVM interface instead determines that one or more program disturbs have not occurred, process 500 may move to step 516. At step 516, the NVM interface can determine whether an end of the super block has been detected. If, at step 516, the NVM interface determines that an end of the super block has not been detected, process 500 may return to step 504.

At step 504, the NVM interface can program user data to a next page of the super block, and at step 506, the NVM interface may determine that the next page is located in a second portion of the NVM. Then, at step 508, the NVM interface can update an outer codeword that is associated with the second portion of the NVM (e.g., a second outer codeword).

Alternatively, at step 506, the NVM interface may determine that the next page is located in the first portion of the NVM. In such a scenario, at step 508, the NVM interface can update the outer codeword associated with the first portion of the NVM (e.g., the first outer codeword). Process 500 may then proceed in a similar manner as described above.

Returning to step 516, if the NVM interface instead determines that an end of the super block has been detected, process 500 may move to step 518. At step 518, the NVM interface can reset the multiple outer codewords to initial states. Process 500 may then end at step 514.

Referring now to FIG. 6, a flowchart of illustrative process 600 is shown for correcting one or more uECC errors in a NVM (e.g., NVM 120 of FIG. 1 or NVM 220 of FIG. 2). In some embodiments, process 600 may represent a more detailed view of garbage collection step 512 of process 500 (FIG. 5).

Process 600 may begin at step 602. At step 604, a NVM interface can read user data stored in a super block. For example, the NVM interface can read user data in order to copy the user data to different memory locations (e.g., blocks or super blocks) in the NVM.

At step 606, the NVM interface can determine if at least one uECC error has been detected in the super block. If, at step 606, the NVM interface determines that at least one uECC error has not been detected in the super block, process 600 may move to step 608.

At step 608, the NVM interface can move the user data to different memory locations in the NVM, and at step 610, the NVM interface can erase the user data stored in the super block. Process 600 may then end at step 612.

Returning to step 606, if the NVM interface determines that at least one uECC error has been detected in the super block, process 600 may move to step 614. At step 614, the NVM interface can identify one or more pages where the at least one uECC error was detected.

Continuing to step 616, the NVM interface can read user data stored in the other pages of the super block (e.g., pages of the super block that excludes the one or more identified pages). Then, at step 618, the NVM interface can use at least one or more outer codewords associated with the super block to recover from the at least one uECC error. For example, the NVM interface can use the one or more outer codewords and user data stored in the other pages to recover from the at least one uECC error. In some cases, for instance, the NVM interface can recover user data stored in the identified pages by reversing out of the one or more outer codewords using user data stored in the other pages (e.g., by subtracting the user data stored in the other pages from the one or more outer codewords). Process 600 may then move to step 608, where the NVM interface can attempt to finish performing garbage collection by moving the user data to different memory locations in the NVM.

It should be understood that processes 500 and 600 of FIGS. 5 and 6, respectively, are merely illustrative. Any of the steps may be removed, modified, or combined, and any additional steps may be added, without departing from the scope of the invention.

In addition, although processes 500 and 600 referred to correcting errors in a super block of a NVM, it will be understood that this is merely illustrative. Thus, errors can be corrected using outer codewords for any suitable number or combination of pages of the NVM such as, for example, one or more super blocks or one or more portions of super blocks (e.g., risk zones) of the NVM.

The described embodiments of the invention are presented for the purpose of illustration and not of limitation.

What is claimed is:

1. A method for correcting for program disturbs in a non-volatile memory ("NVM"), the non-volatile memory comprising a plurality of super blocks, the method comprising:
   programming user data to a page of a super block of the plurality of super blocks, wherein the page is located in a first portion of the NVM;
   updating a first outer codeword of a plurality of outer codewords that is associated with the first portion of the NVM, wherein the first outer codeword is stored in volatile memory, wherein outer codewords are generated by applying an error correction code to user data;
   detecting if a program disturb has occurred in the super block;
   in response to detecting that the program disturb has occurred, performing garbage collection on the super block; and
   using at least the updated first outer codeword to recover from uncorrectable error correction code ("uECC") errors detected in the super block.

2. The method of claim 1, wherein each of the plurality of outer codewords is associated with a portion of the NVM.

3. The method of claim 1, wherein the first portion of the NVM is a vertical portion of the NVM.

4. The method of claim 3, wherein the vertical portion comprises one of a die, a bus, a chip enable line, or a bank of the NVM.

5. The method of claim 1, wherein each of the plurality of outer codes is associated with a stripe of the super block.

6. The method of claim 1, further comprising:
   in response to detecting that a program disturb has not occurred, programming the user data to a next page of the super block, wherein the next page is located in a second portion of the NVM; and
   updating a second outer codeword that is associated with the second portion of the NVM.

7. The method of claim 1, further comprising:
   in response to detecting that a program disturb has not occurred, programming the user data to a next page of the super block, wherein the next page is located in the first portion of the NVM; and
   updating the first outer codeword.

8. The method of claim 1, further comprising:
   detecting an end of the super block; and
   resetting the plurality of outer codewords to initial states.

9. A system comprising:
   non-volatile memory ("NVM") comprising a plurality of super blocks;
   volatile memory for storing a first set of outer codewords of a plurality of outer codewords, wherein the first set of outer codewords is associated with a first portion of the NVM, wherein outer codewords are generated by applying an error correction code to user data; and
   control circuitry operative to:
      program user data to a page of a super block located in the first portion of the NVM;
      update the first set of outer codewords;
      detect if at least one program disturb has occurred;
      in response to detecting that the at least one program disturb has occurred, perform garbage collection on the super block; and
      using at least the updated first set of outer codewords to recover from an uncorrectable error correction code ("uECC") error detected in the page.

10. The system of claim 9, wherein the control circuitry is operative to:
    read user data stored in other pages of the super block; and
    reverse out of the plurality of outer codewords using the user data stored in the other pages of the super block.

11. The system of claim 9, wherein each of the plurality of outer codewords is associated with a vertical portion of the NVM.

12. The system of claim 9, wherein each of the plurality of outer codewords is associated with a horizontal portion of the NVM.

13. The system of claim 9, wherein the volatile memory is operative to store a second set of outer codewords, wherein the second set of outer codewords is associated with a second portion of the NVM.

14. The system of claim 13, wherein the control circuitry is operative to:
    detect an end of the super block;
    reset the first set of outer codewords and the second set of outer codewords to initial states;
    program the user data to a page of a new super block located in the first portion of the NVM; and
    update the first set of outer codewords.

15. The system of claim 13, wherein the volatile memory comprises a first buffer operative to store the first set of outer codewords and a second buffer operative to store the second set of outer codewords.

16. The system of claim 13, wherein the volatile memory comprises at least one circular buffer operative to store the first set of outer codewords and the second set of outer codewords.

17. The system of claim 13, wherein the control circuitry is operative to:
in response to detecting that the at least one program disturb has not occurred, program user data to a next page of the super block located in the second portion of the NVM; and
update the second set of outer codewords stored in the volatile memory.

18. Apparatus for handling program disturbs in a non-volatile memory, the apparatus comprising:
non-volatile memory ("NVM") comprising a plurality of stripes;
volatile memory for storing a plurality of outer codewords, wherein each outer codeword of the plurality of outer codewords is associated with a stripe of the plurality of stripes; wherein outer codewords are generated by applying an error correction code to user data; and
control circuitry operative to:
determine a risk zone in the NVM based on at least one characteristic of the NVM, wherein the risk zone comprises at least one stripe of the plurality of stripes;
program user data to a page of the risk zone, wherein the page is located in a first stripe of the plurality of stripes;
update a first outer codeword of the plurality of outer codewords, wherein the first outer codeword is associated with the first stripe;
detect if an end of the risk zone has been reached; and
in response to detecting that an end of the risk zone has been reached, reset
the plurality of outer codewords to a plurality of initial states.

19. The apparatus of claim 18, wherein the control circuitry is operative to:
apply an error correcting code to user data stored in the page to generate error correction code data; and
update the first outer codeword with the error correction code data.

20. The apparatus of claim 18, wherein the at least one characteristic comprises a description of pages that are affected by program failures.

21. The apparatus of claim 18, wherein the risk zone comprises a portion of the NVM determined to be most susceptible to corruption.

22. The apparatus of claim 18, wherein the volatile memory comprises a circular buffer, wherein the circular buffer comprises a set of buffer elements, wherein each buffer element is operative to store an outer codeword of the plurality of outer codewords.

23. The apparatus of claim 22, wherein the circular buffer comprises a first buffer element operative to store the first outer codeword and a second buffer element operative to store a second outer codeword that is associated with a second stripe of the NVM.

24. The apparatus of claim 23, wherein the control circuitry is operative to:
in response to detecting that an end of the risk zone has not been reached, program user data to a next page of the risk zone, wherein the next page is located in the second stripe of the NVM;
iterate to the second buffer element of the circular buffer; and
update the second outer codeword stored in the second buffer element.

25. The apparatus of claim 18, wherein the volatile memory comprises a buffer operative to store the first outer codeword.

26. The apparatus of claim 25, wherein the control circuitry is operative to:
in response to detecting that an end of the risk zone has not been reached, program user data to a next page of the risk zone, wherein the next page is located in a second stripe of the NVM;
copy the first outer codeword from the buffer to a different location in the volatile memory; and
store a second outer codeword that is associated with the second stripe of the NVM in the buffer.

27. The apparatus of claim 18, wherein the volatile memory comprises a first buffer operative to store the first outer codeword and a second buffer.

28. The apparatus of claim 27, wherein the control circuitry is operative to:
in response to detecting that an end of the risk zone has not been reached, program user data to a next page of the risk zone, wherein the next page is located in a second stripe of the NVM;
use the second buffer to store a second outer codeword that is associated with the second stripe of the NVM.

* * * * *